(12) United States Patent
Eid

(10) Patent No.: US 10,264,671 B2
(45) Date of Patent: Apr. 16, 2019

(54) MICROELECTRONIC DEVICES DESIGNED WITH MODULAR SUBSTRATES HAVING INTEGRATED FUSES

(71) Applicant: Intel Corporation, Santa Clara, CA (US)

(72) Inventor: Feras Eid, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 22 days.

(21) Appl. No.: 15/639,870

(22) Filed: Jun. 30, 2017

(65) Prior Publication Data
US 2019/0006282 A1    Jan. 3, 2019

(51) Int. Cl.
| | |
|---|---|
| *H05K 1/02* | (2006.01) |
| *H01L 23/538* | (2006.01) |
| *H01L 23/498* | (2006.01) |
| *H01H 85/08* | (2006.01) |
| *G06F 1/16* | (2006.01) |

(52) U.S. Cl.
CPC .............. *H05K 1/029* (2013.01); *G06F 1/16* (2013.01); *H01H 85/08* (2013.01); *H01L 23/49816* (2013.01); *H01L 23/49833* (2013.01); *H01L 23/49838* (2013.01); *H01L 23/49894* (2013.01); *H01L 23/5382* (2013.01)

(58) Field of Classification Search
CPC .... H05K 1/0286; H05K 1/0287; H05K 1/029; H05K 1/0292; H05K 1/0293; H05K 1/0295
See application file for complete search history.

(56) References Cited

U.S. PATENT DOCUMENTS 6,218,213 B1 *   4/2001   Fjelstad .............. H01L 21/4821
                                                      257/E23.046

* cited by examiner

*Primary Examiner* — Jeremy C Norris
(74) *Attorney, Agent, or Firm* — Schwabe, Williamson & Wyatt, P.C.

(57) ABSTRACT

Embodiments of the invention include a microelectronic device that includes a plurality of organic dielectric layers, a cavity formed in at least one organic dielectric layer of the plurality of organic dielectric layers and a modular structure having first and second ports and a conductive member that is formed within the cavity. The conductive member provides modularity by being capable of connecting the first and second ports and also disconnecting the first and second ports.

23 Claims, 7 Drawing Sheets

MICROELECTRONIC DEVICES DESIGNED WITH MODULAR SUBSTRATES HAVING INTEGRATED FUSES

FIELD OF THE INVENTION

Embodiments of the present invention relate generally to the manufacture of semiconductor devices. In particular, embodiments of the present invention relate to microelectronic devices that are designed with modular substrates having integrated fuses.

BACKGROUND OF THE INVENTION

One prior approach for semiconductor packages having limited modularity uses discrete components like switches to provide some modularity, or designing a large substrate with separate regions for connecting different components, and then only connecting the desired components to the regions of interest, which results in wasted substrate real estate. Both of these approaches have the expense of added size and cost due to the un-utilized substrate areas and the additional discrete components like switches that need to be purchased and assembled.

DETAILED DESCRIPTION OF THE INVENTION

Described herein are modular substrates having substrate integrated fuses.

In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order to not obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

In many of today's semiconductor packages, having a modular substrate, i.e., one that can be manufactured according to a common generic design and then customized in a last operation to allow connecting different components and systems, is desirable. A modular substrate allows using the same processes and fabrication tools to manufacture large volumes of substrates for multiple products, which results in better tool utilization and cost reduction. Truly modular substrates do not exist today.

The present design includes an architecture that enables modular substrates by creating package-integrated fuses. Substrates are manufactured according to a unified generic design with built-in released beams acting as fuses that form the modular connections. Once a bill of materials (BOM) is finalized and the system components that are to be attached to the substrate are determined, only the connections that enable the desired routing are retained. All other fuses are blown off by sending a large current through them, effectively customizing the substrate layout in this final post-manufacturing step.

Figure 4:
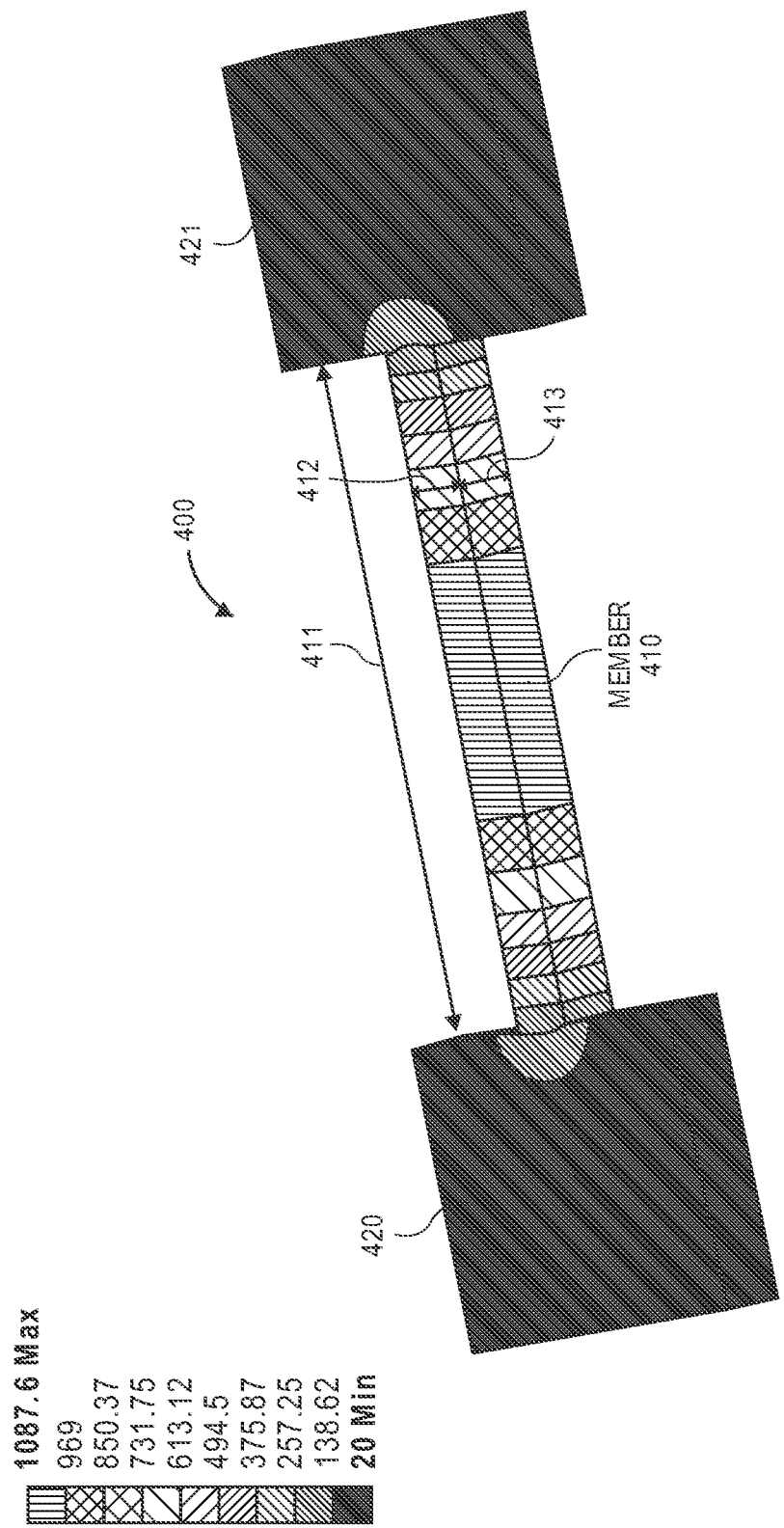
FIG. 4 illustrates a temperature distribution for a configuration of a modular structure 400 having package ports (e.g., pads) and a fuse (e.g., conductive straight member) having dielectric material removed adjacent to the conductive member in accordance with one embodiment.
Figure 5:
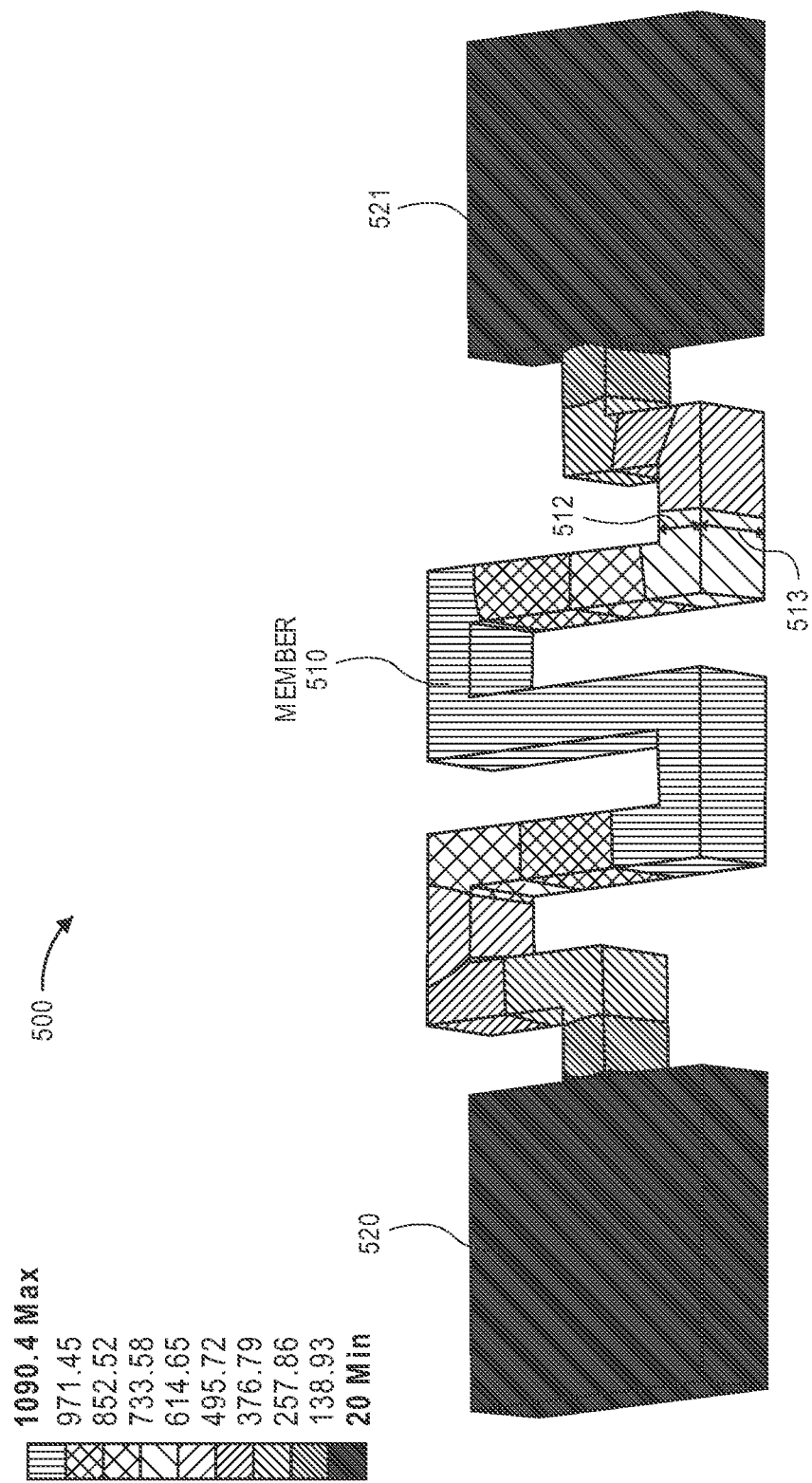
FIG. 5 illustrates a temperature distribution for a configuration of a modular structure 500 having package ports (e.g., pads) and a fuse (e.g., conductive meandered member) having dielectric material removed adjacent to the conductive meandered member in accordance with one embodiment.

The present design enables a new highly desired functionality of substrate modularity which does not exist in today's substrates. The fuses required to enable this functionality are built as part of the substrate layers and therefore do not add any z-height to the substrate. The fuses are created during substrate buildup using existing manufacturing steps and therefore do not require purchasing and assembling discrete components, which helps reduce BOM cost and substrate form factor. The xy area required by those fuses can be kept minimal (e.g., on the order of 0.01 mm$^2$ per fuse as shown in FIGS. 4 and 5 below), which helps avoid increasing the substrate lateral xy size substantially. The present design creates package integrated fuses to enable substrate modularity.

Figure 1:
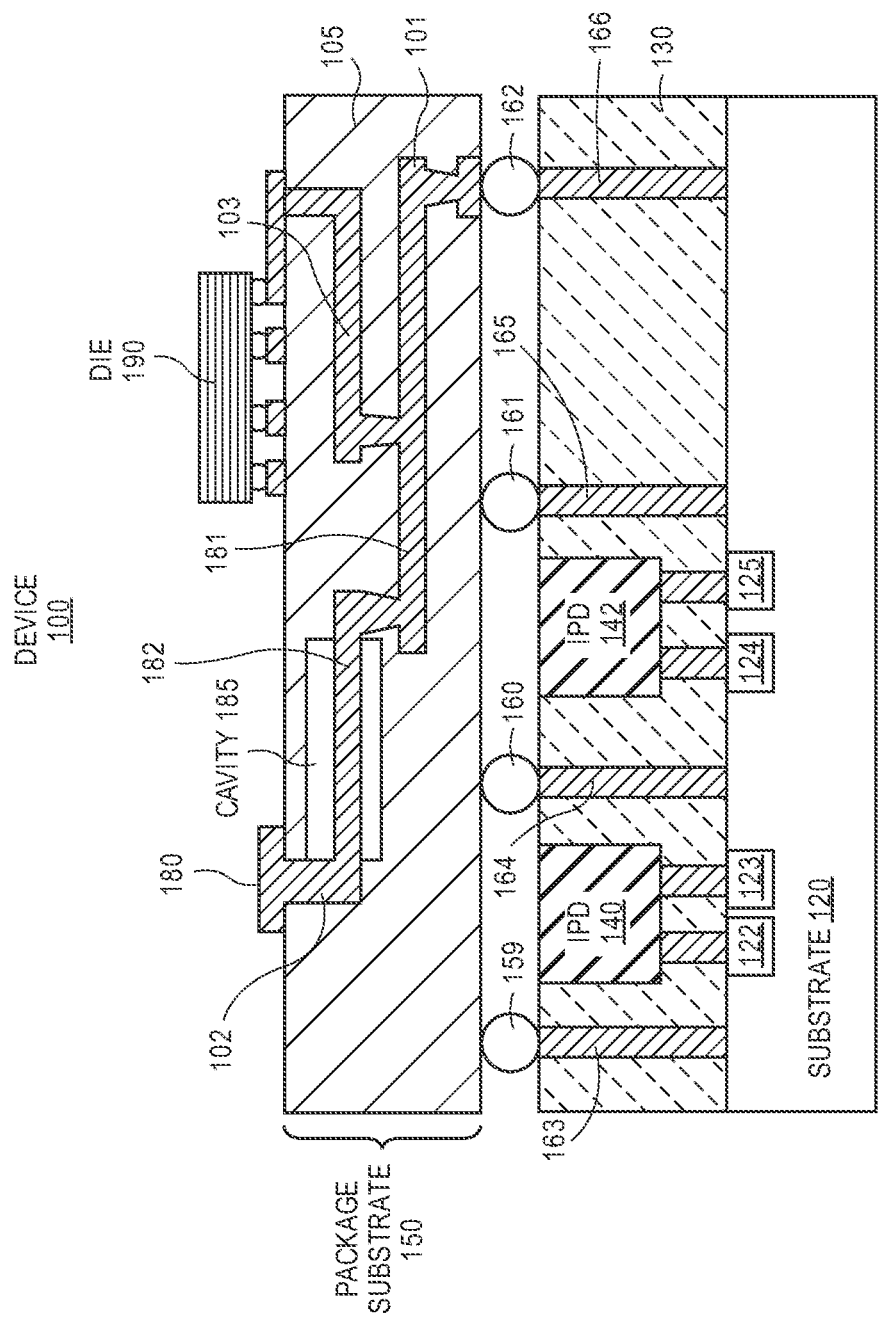
FIG. 1 illustrates a microelectronic device having modular substrate integrated fuses and a substrate in accordance with one embodiment.

FIG. 1 illustrates a microelectronic device having modular substrate integrated fuses and a substrate in accordance with one embodiment. The microelectronic device 100 includes an optional substrate 120 and a modular package substrate 150 having a fuse 182 (e.g., conductive member, trace) with conductive ports 180 and 181 (e.g., pad 180 and trace 181). The package substrate 150 includes conductive layers (e.g., 101, 103), connections (e.g., 102) and dielectric material 105 (e.g., organic material, low temperature co-fired ceramic materials, liquid crystal polymers, etc.) of package layers. The fuse 182 is formed within a cavity 185.

The components 122-125 of the substrate 120 and IPDs (Integrated Passive Devices) 140 and 142 can communicate with components of the substrate 150 or other components not shown in FIG. 1 using connections 163-166 and solder balls 159-162. The IPDs may include any type of passives including inductors, transformers, capacitors, and resistors. In one example, capacitors on the IPD die may be used for power delivery. In another example, resistors on the same or a different IPD may be used for digital signal equalization. In another example, the substrate 120 is a printed circuit board.

The fuses can be created during substrate manufacturing as part of the build up layers of the substrate 150. The fuses can also be coupled to the die 190. In one example, the fuse 182 couples the ports 180 and 181. Thus, the port 180 and any component coupled to the port 180 is also coupled to the die 190. In another example, a blown fuse 182 causes the port 180 to be disconnected from the die 190.

Figure 2A:
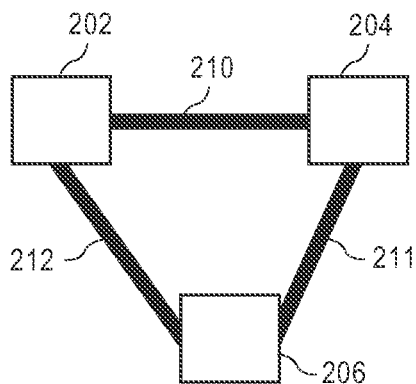
FIGS. 2A-2H illustrate different configurations of a modular structure having package ports (e.g., pads) and fuses for enabling substrate modularity in accordance with one embodiment.
Figure 2B:
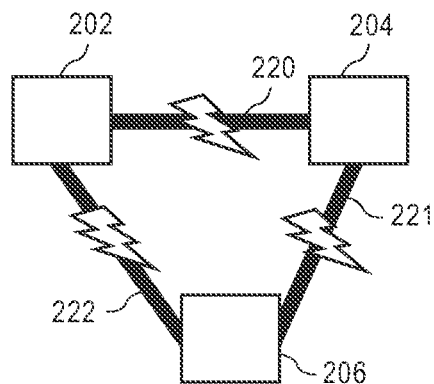

FIGS. 2A-2H illustrate different configurations of a modular structure having package ports (e.g., pads) and fuses for enabling substrate modularity in accordance with one embodiment. FIG. 2A illustrates a first configuration with 3 package ports 202, 204, and 206 and fuses 210-212 to connect these package ports. FIGS. 2B-2H illustrate configurations in which at least one fuse is selectively blown by applying a high current through the fuse. FIG. 2B illustrates a second configuration with 3 package ports 202, 204, and 206 and blown fuses 220-222 to disconnect these package ports from each other. In this example, the fuses 220-222 have all been blown.

Figure 2C:
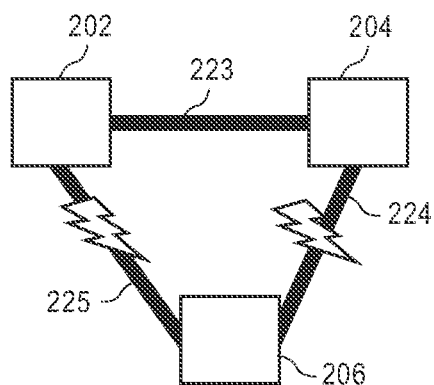

FIG. 2C illustrates a third configuration with 3 package ports 202, 204, and 206 and fuses 223-225 to connect or disconnect these package ports from each other. In this example, the fuses 224 and 225 have been blown.

Figure 2D:
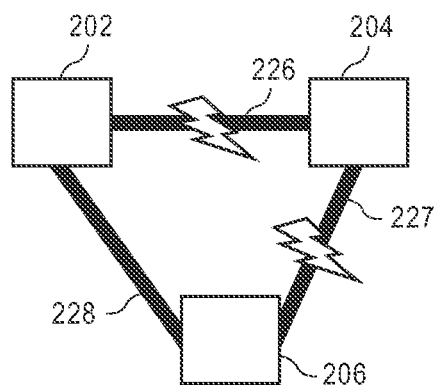

FIG. 2D illustrates a fourth configuration with 3 package ports 202, 204, and 206 and fuses 226-228 to connect or disconnect these package ports from each other. In this example, the fuses 226 and 227 have been blown.

Figure 2E:
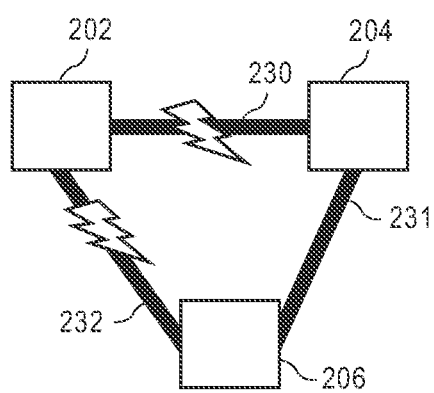

FIG. 2E illustrates a fifth configuration with 3 package ports 202, 204, and 206 and fuses 230-232 to connect or disconnect these package ports from each other. In this example, the fuses 230 and 232 have been blown.

Figure 2F:
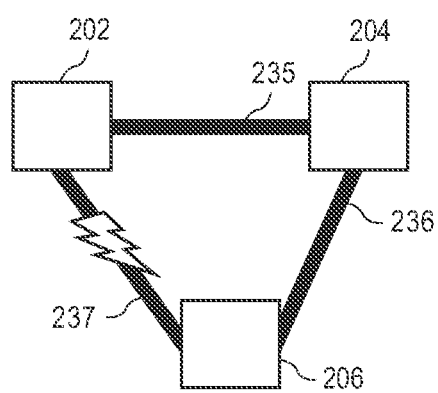

FIG. 2F illustrates a sixth configuration with 3 package ports 202, 204, and 206 and fuses 235-237 to connect or disconnect these package ports from each other. In this example, the fuse 237 has been blown.

Figures 2G, 2H:
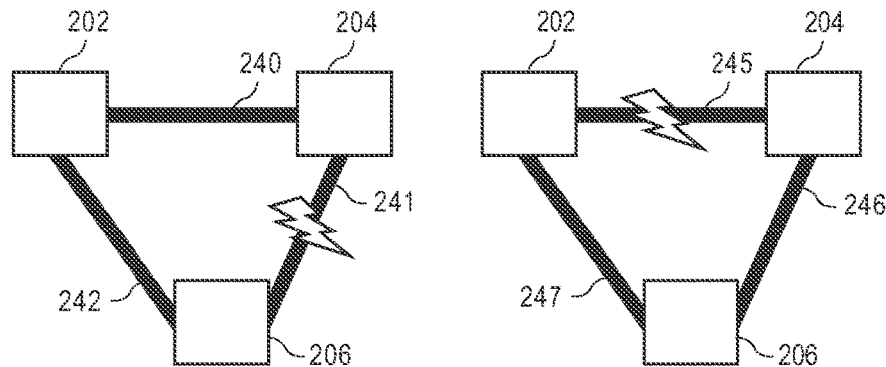

FIG. 2G illustrates a seventh configuration with 3 package ports 202, 204, and 206 and fuses 240-242 to connect or disconnect these package ports from each other. In this example, the fuse 241 has been blown.

FIG. 2H illustrates an eighth configuration with 3 package ports 202, 204, and 206 and fuses 245-247 to connect or disconnect these package ports from each other. In this example, the fuse 245 has been blown.

This design effectively enables $2^N$ different configurations (e.g., $2^3=8$ different configurations as shown in FIGS. 2A-2H) of package ports and fuses. In general, for ports (e.g., pads) connected using N fuses, the number of possible configurations enabled by blowing off any combination of those fuses is $2^n$. This allows a large number of possible connections, and thus increases modularity, even using a relatively small number of fuses, as shown in Table 1.

TABLE 1

Number of combinations allowed by using different numbers of fuses, and the additional substrate area required.

| Number of fuses | Number of possible combinations allowed | Added substrate xy area |
| --- | --- | --- |
| 3 | 8 | ~0.03 mm$^2$ |
| 10 | 1024 | ~0.1 mm$^2$ |
| 100 | $1.27 \times 10^{30}$ | ~1 mm$^2$ |

Figure 3A:
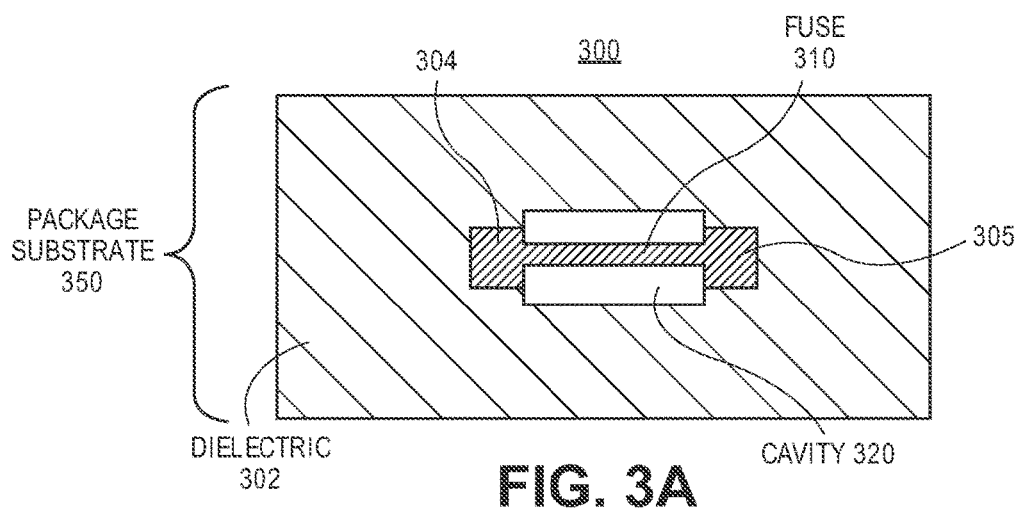
FIG. 3A illustrates a top view of a microelectronic device 300 having a package substrate integrated fuse in accordance with one embodiment.
Figure 3B:
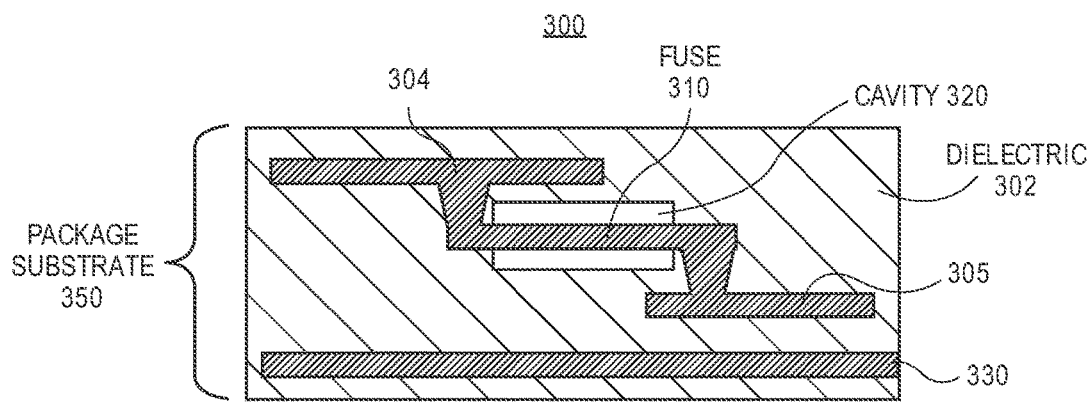
FIG. 3B illustrates a side view of the microelectronic device 300 having a package substrate integrated fuse in accordance with one embodiment.

FIG. 3A illustrates a top view of a microelectronic device 300 having a package substrate integrated fuse in accordance with one embodiment. The package substrate 350 includes conductive ports 304 and 305 (e.g., pads), cavity 320 formed in organic dielectric material 302, and conductive fuse 310 (e.g., conductive member). The fuse can be embedded in an organic package substrate 350 and electrically routed with the standard conductive layers (e.g., 330) and connections in the package substrate. FIG. 3B illustrates a side view of package substrate integrated fuse in accordance with one embodiment.

The fuses are conductive members (e.g., traces) connected to pads on either side as shown in a package substrate having a cavity in FIGS. 3A and 3B in accordance with one embodiment. Those traces are released by removing the organic dielectric around them. Many fuses are manufactured between different pads or ports to enable modular connections. After substrate manufacturing, the undesired connections are removed by sending a high current through the fuses forming these undesired connections. The applied current induces Joule heating which raises the temperature of a given section of the trace above a critical threshold (e.g., melting point or temperature threshold at which thermomechanical stress from constrained expansion exceeds strength of trace) causing the section of the trace to fail or break.

The conductive trace does not have to be straight as shown. The conductive trace including the conductive member can be any shape (e.g., curved, meandered, etc.), and one or more fuses can be created in different substrate layers (e.g., internal intermediate layers, external surface layers of the package substrate, etc.).

FIG. 4 illustrates a temperature distribution for a configuration of a modular structure 400 having package ports (e.g., pads) and a fuse (e.g., conductive straight member) having dielectric material removed adjacent to the conductive member in accordance with one embodiment. The structure 400 includes a conductive member 410 having a length 411 (e.g., 50-150 microns), a width 412 (e.g., 5-15 microns), and a height 413 (e.g., 10-20 microns). The conductive member 410 is coupled to the ports 420 and 421. The conductive member 410 when formed with Copper has a melting point of approximately 1083 degrees Celsius. In one example, thermal simulations show that a voltage of about 0.3 volts applied between the ports (e.g., pads) causes the conductive member to reach a maximum temperature of about 1087 degrees Celsius as illustrated in FIG. 4 and therefore melt. In contrast, when the organic dielectric around the fuse is retained, the highest temperature predicted by the thermal simulation is about 989 degrees Celsius which is below the melting temperature of Copper.

The process for removing the dielectric around the conductive trace having the conductive member includes masking the fuse layer to only expose the fuse itself and the surrounding dielectric to be removed. The process continues by applying a subtractive process such as reactive ion etching to remove the dielectric.

Removing the dielectric around the trace allows more of the heat from Joule heating to be retained in the trace due to the thermal conductivity of air being 1-2 orders of magnitude less than that of the dielectric. When the dielectric is removed, the main source of heat loss from the trace becomes radiation, which is much smaller than the heat lost by conduction through the dielectric if the dielectric is retained. This results in a significant temperature increase for the case in which the dielectric is removed, even when applying the same current.

Removing the dielectric around the trace localizes the temperature increase to the fuse itself without damaging nearby areas. For example, most organic dielectrics start to thermally decompose above approximately 260 degrees C. If the dielectric around the fuse is not removed, its temperature can rise well above that limit, causing degassing, delamination, etc.

The temperature increase (above ambient) to the first order in a released conductive member is proportional to $I^2L^2/A^2$, where L and A are the conductive member length and cross-sectional area, and I is the applied current. Therefore, the current needed to blow the fuse can be reduced by either increasing the effective length or reducing the cross sectional area of the trace. The length can be increased by using a meandered structure as shown in FIG. 5.

FIG. 5 illustrates a temperature distribution for a configuration of a modular structure 500 having package ports (e.g., pads) and a fuse (e.g., conductive meandered member) having dielectric material removed adjacent to the conductive meandered member in accordance with one embodiment. The conductive member 510 has a length 511 (e.g., 100-450 microns), a width 512 (e.g., 5-15 microns), and a height 513 (e.g., 10-20 microns). The conductive member 510 is coupled to the ports 520 and 521. The conductive member 510 when formed with Copper has a melting point of approximately 1083 degrees Celsius. In one example, thermal simulations show that a current that is only approximately 40% of that used for the straight member in FIG. 4 is sufficient to cause the meandered member to melt by producing a maximum temperature of about 1090 degrees Celsius in it as illustrated in FIG. 5.

Note that this meandered member 510 (e.g., meandered structure) fits within the same xy area as that in FIG. 4. However, the meandered member 510 has an effective length that is about 2.5 times that of the straight member 410 in FIG. 4. This allows reducing the current by about 2.5 times, from approximately 13 Amps in FIG. 4 to about 5 Amps in FIG. 5, to induce the same temperature rise in the member. Further reduction in current amplitude (e.g., approximately 1 Amp or less) can be achieved by increasing the overall member length by allocating a larger xy area for the fuse, and/or using thinner members (e.g., enabled by next generation process tools), and/or by plating the fuse layer to a smaller thickness (e.g., 5-10 microns instead of 15-20 microns). This can help reduce the number of solder balls that have to be utilized in parallel to send the required current through the package substrate.

Even though the embodiments shown in FIGS. 4 and 5 show a single trace (e.g., member) connected between two pads, the present design can also be extended to configurations with more than a single connection. For example, FIGS. 6 and 7 show two examples of bundled straight and meandered traces (e.g., members) connecting a central pad to 4 surrounding pads.

Figure 6:
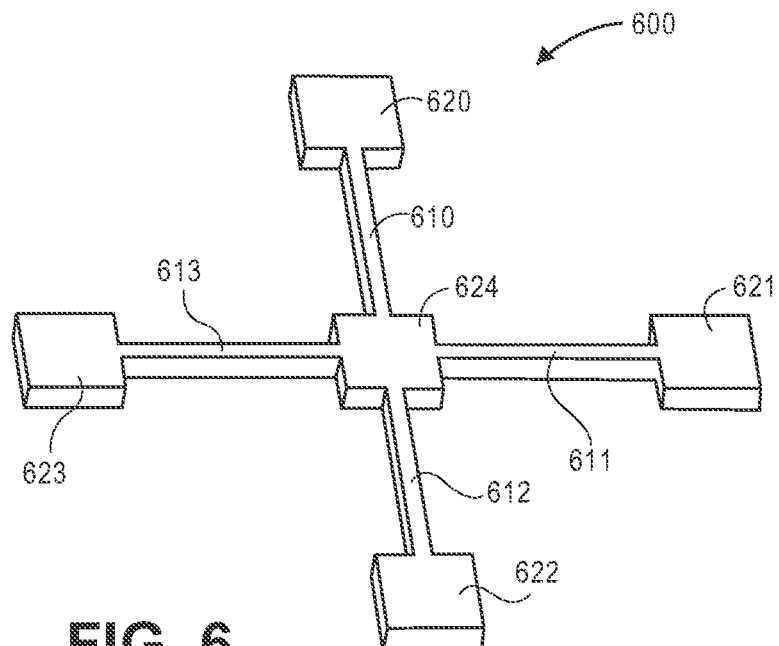
FIG. 6 illustrates a configuration of a modular structure 600 having package ports (e.g., pads) and fuses (e.g., conductive straight members) having dielectric material removed adjacent to the conductive members in accordance with one embodiment.

FIG. 6 illustrates a configuration of a modular structure 600 having package ports (e.g., pads) and fuses (e.g., conductive straight members) having dielectric material removed adjacent to the conductive members in accordance with one embodiment. The package ports 620-623 couple to a central package port 624 with members 610-613, respectively. In this example, the members 610-613 are straight and provide fuses that can connect or disconnect the package ports to the central package port.

Figure 7:
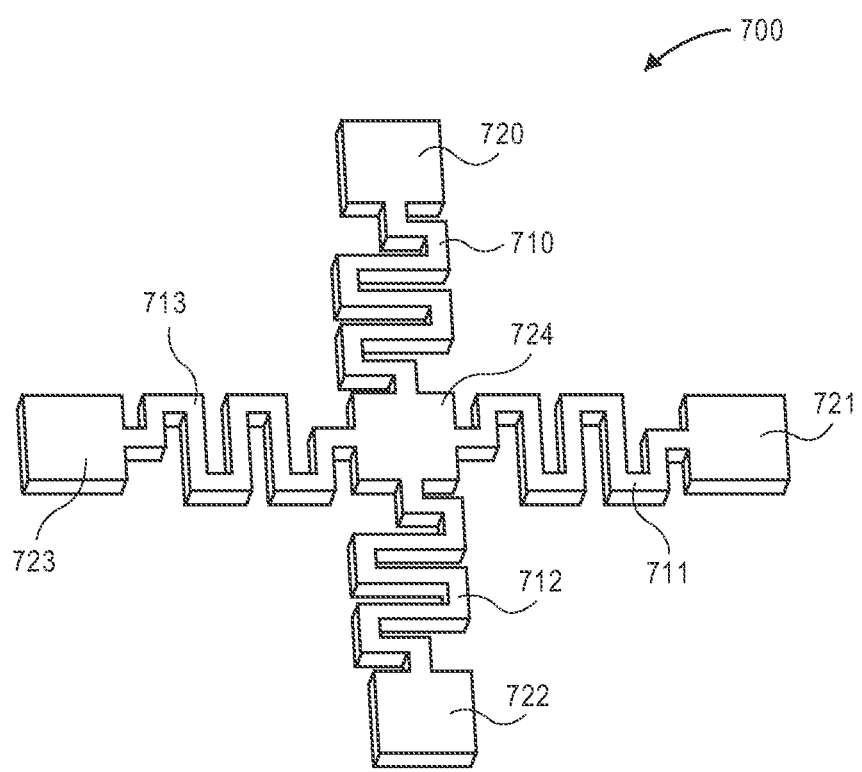
FIG. 7 illustrates a configuration of a modular structure 700 having package ports (e.g., pads) and fuses (e.g., conductive meandering members) having dielectric material removed adjacent to the conductive members in accordance with one embodiment.

FIG. 7 illustrates a configuration of a modular structure 700 having package ports (e.g., pads) and fuses (e.g., conductive meandering members) having dielectric material removed adjacent to the conductive members in accordance with one embodiment. The package ports 720-723 couple to a central package port 724 with members 710-713, respectively. In this example, the members 710-713 are meandering and provide fuses that can connect or disconnect the package ports to the central package port.

Other configurations with a different connection layout, a different number of connections/pads, and/or combining different trace shapes (straight, meandered, curved, etc.) in the same bundle can also be envisioned.

It will be appreciated that, in a system on a chip embodiment, the die may include a processor, memory, communications circuitry and the like. Though a single die is illustrated, there may be none, one or several dies included in the same region of the microelectronic device.

In one embodiment, the microelectronic device may be a substrate that includes conductive layers, connections and dielectric material (e.g., organic material, low temperature co-fired ceramic materials, liquid crystal polymers, etc.) of package layers. Although a few examples of materials from which the substrate may be formed are described here, any material that may serve as a foundation upon which a semiconductor device may be built falls within the scope of the present invention.

One or more contacts may be formed on a surface of the microelectronic device. The contacts may include one or more conductive layers. By way of example, the contacts may include barrier layers, organic surface protection (OSP) layers, metallic layers, or any combination thereof. The contacts may provide electrical connections to active device circuitry (not shown) within the die. Embodiments of the invention include one or more solder bumps or solder joints that are each electrically coupled to a contact. The solder bumps or solder joints may be electrically coupled to the contacts by one or more redistribution layers and conductive vias.

Figure 8:
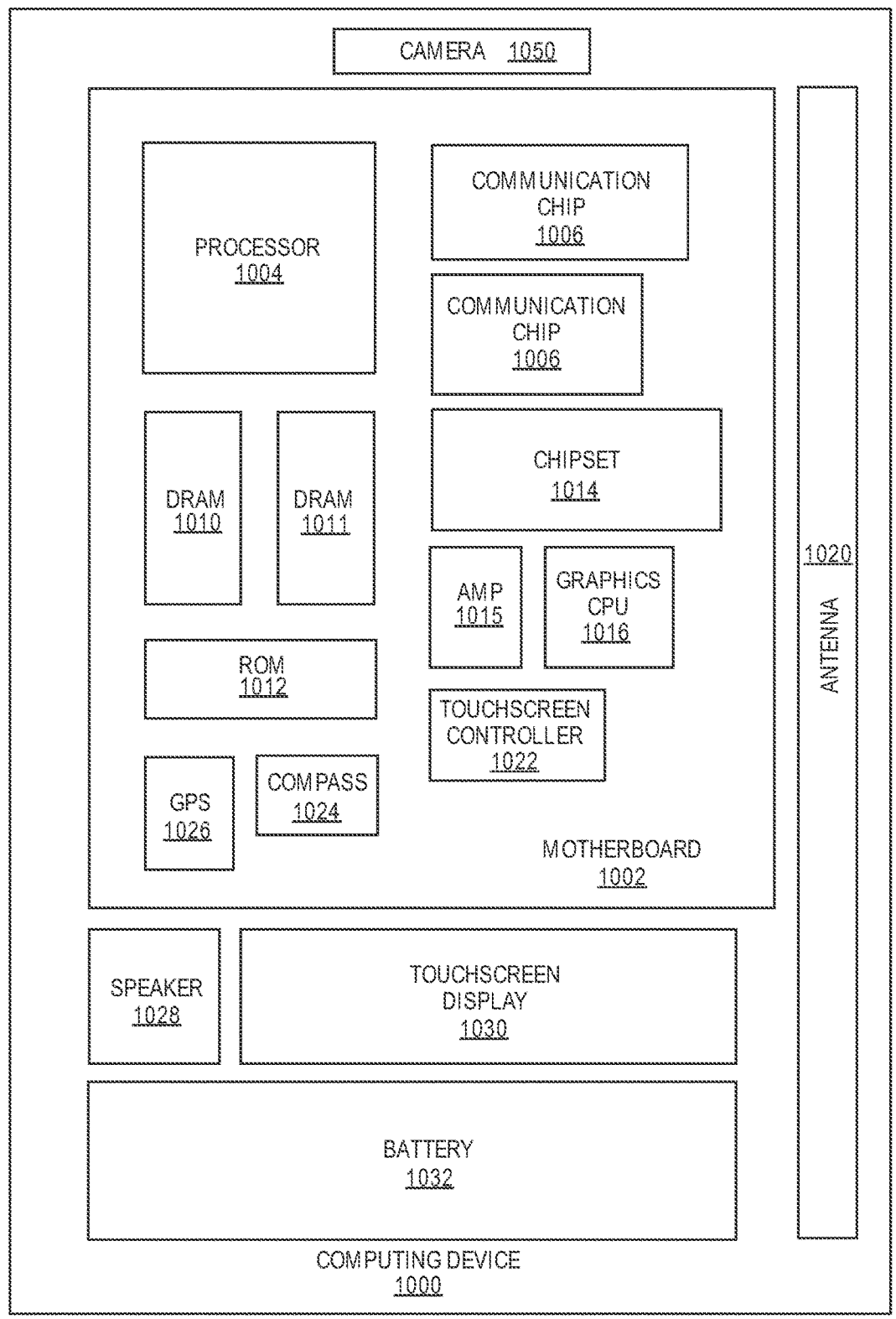
FIG. 8 illustrates a computing device 1000 in accordance with one embodiment.

FIG. 8 illustrates a computing device 1000 in accordance with one embodiment. The computing device 1000 houses a board 1002. The board (e.g., motherboard, printed circuit board, etc.) may include a number of components, including but not limited to at least one processor 1004 and at least one communication chip 1006. The at least one processor 1004 is physically and electrically coupled to the board 1002. In some implementations, the at least one communication chip 1006 is also physically and electrically coupled to the board 1002. In further implementations, the communication chip 1006 (e.g., microelectronic device 100, 300, microelectronic device having modular structures, etc.) is part of the processor 1004.

Depending on its applications, computing device 1000 may include other components that may or may not be physically and electrically coupled to the board 1002. These other components include, but are not limited to, volatile memory (e.g., DRAM 1010, 1011), non-volatile memory (e.g., ROM 1012), flash memory, a graphics processor 1016, a digital signal processor, a crypto processor, a chipset 1014, an antenna unit 1020, a display, a touchscreen display 1030, a touchscreen controller 1022, a battery 1032, an audio codec, a video codec, a power amplifier 1015, a global positioning system (GPS) device 1026, a compass 1024, a gyroscope, a speaker, a camera 1050, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), WiGig, IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi, WiGig, and Bluetooth and a second communication chip 1006 may be dedicated to longer range wireless communications such as GPS, EDGE, GPRS, CDMA, WiMAX, LTE, Ev-DO, 5G, and others.

The at least one processor 1004 of the computing device 1000 includes an integrated circuit die packaged within the at least one processor 1004. In some embodiments of the invention, the processor package includes one or more devices, such as microelectronic devices (e.g., microelectronic device 100, 300, etc.) having modular structures with substrates containing integrated fuses in accordance with implementations of embodiments of the invention. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of embodiments of the invention, the communication chip package includes one or more microelectronic devices (e.g., microelectronic device 100, 300, etc.) having modular structures with substrates containing integrated fuses.

The following examples pertain to further embodiments. Example 1 is a microelectronic device comprising a plurality of organic dielectric layers, a cavity formed in at least one organic dielectric layer of the plurality of organic dielectric layers and a modular structure having first and second ports and a first conductive member that is formed within the cavity. The first conductive member provides modularity by being capable of connecting the first and second ports and also disconnecting the first and second ports.

In example 2, the subject matter of example 1 can optionally include the cavity that is formed by removing the at least one organic dielectric in proximity to the first conductive member to release the first conductive member.

In example 3, the subject matter of any of examples 1-2 can optionally include the first conductive member that disconnects the first and second ports when a threshold voltage is applied between the first and second ports to cause the first conductive member to heat up to a melting point of the first conductive member.

In example 4, the subject matter of any of examples 1-3 can optionally include the modular structure that further comprises a third port, a second conductive member, and a third conductive member with the second conductive member being coupled to the second and third ports while the third conductive member is coupled to the first and third ports.

In example 5, the subject matter of any of examples 1-4 can optionally include the second conductive member that provides modularity by being capable of connecting the second and third ports and also disconnecting the second and third ports.

In example 6, the subject matter of any of examples 1-5 can optionally include the first, second, and third conductive members that each comprise fuses that are integrated with the plurality of organic dielectric layers of a package substrate without increasing a height of the package substrate.

In example 7, the subject matter of any of examples 1-6 can optionally include the second and third conductive members that are formed within the cavity or one or more additional cavities of the plurality of organic dielectric layers of the package substrate.

In example 8, the subject matter of any of examples 1-7 can optionally include the first, second, and third conductive members that each comprise straight members.

In example 9, the subject matter of any of examples 1-7 can optionally include the first, second, and third conductive members that each comprise meandering members to increase a length of the member in comparison to a straight member.

In example 10, the subject matter of any of examples 1-9 can optionally include the first, second, and third conductive members provide eight different configurations of modularity for the microelectronic device.

Example 11 is a modular structure comprising first and second ports of a package substrate having a plurality of organic dielectric layers and a first conductive member that is formed within a cavity of the package substrate. The first conductive member provides modularity by being capable of connecting the first and second ports and also disconnecting the first and second ports.

In example 12, the subject matter of example 11 can optionally include the cavity that is formed by removing at least one organic dielectric in proximity to the first conductive member to release the first conductive member.

In example 13, the subject matter of any of examples 11-12 can optionally include the first conductive member that disconnects the first and second ports when a threshold voltage is applied between the first and second ports to cause the first conductive member to heat up to a melting point of the first conductive member.

In example 14, the subject matter of any of examples 11-13 can optionally include the modular structure that further comprises a third port, a second conductive member, and a third conductive member with the second conductive member being coupled to the second and third ports while the third conductive member is coupled to the first and third ports.

In example 15, the subject matter of any of examples 11-14 can optionally include the second conductive member that provides modularity by being capable of connecting the second and third ports and also disconnecting the second and third ports.

In example 16, the subject matter of any of examples 11-15 can optionally include the first, second, and third conductive members that each comprise fuses that are integrated with the plurality of organic dielectric layers of the package substrate without increasing a height of the package substrate.

In example 17, the subject matter of any of examples 11-16 can optionally include the second and third conductive members are formed within the cavity or one or more additional cavities of the plurality of organic dielectric layers of the package substrate.

In example 18, the subject matter of any of examples 11-17 can optionally include the first, second, and third conductive members that each comprise straight members.

In example 19, the subject matter of any of examples 11-17 can optionally include the first, second, and third conductive members that each comprise meandering members to increase a length of the member in comparison to a straight member.

In example 20, the subject matter of any of examples 11-19 can optionally include the first, second, and third conductive members that provide eight different configurations of modularity for the modular structure.

Example 21 is a computing device comprising at least one processor to process data and a communication module or chip coupled to the at least one processor. The communication module or chip comprises a substrate having a plurality of organic dielectric layers, a cavity formed in at least one organic dielectric layer of the plurality of organic dielectric layers, and a modular structure having first and second ports and a conductive member that is formed within the cavity. The conductive member provides modularity by being capable of connecting the first and second ports and also disconnecting the first and second ports.

In example 22, the subject matter of example 21 can optionally include the cavity that is formed by removing the at least one organic dielectric in proximity to the conductive member to release the conductive member.

In example 23, the subject matter of any of examples 21-22 can optionally include the conductive member that disconnects the first and second ports when a threshold voltage is applied between the first and second ports to cause the conductive member to heat up to a melting point of the conductive member.

The invention claimed is:

1. A microelectronic device comprising:
a plurality of organic dielectric layers;
a cavity formed in at least one organic dielectric layer of the plurality of organic dielectric layers; and
a modular structure having first and second ports and a first conductive member that is formed within the cavity, the first conductive member provides modularity by being capable of connecting the first and second ports and also disconnecting the first and second ports, wherein the first and second ports are embedded in the plurality of organic dielectric layers.

2. The microelectronic device of claim 1, wherein the cavity is formed by removing the at least one organic dielectric in proximity to the first conductive member to release the first conductive member.

3. The microelectronic device of claim 1, wherein the first conductive member disconnects the first and second ports when a threshold voltage is applied between the first and second ports to cause the first conductive member to heat up to a melting point of the first conductive member.

4. The microelectronic device of claim 1, wherein the modular structure further comprises a third port, a second conductive member, and a third conductive member with the second conductive member being coupled to the second and third ports while the third conductive member is coupled to the first and third ports.

5. The microelectronic device of claim 4, wherein the second conductive member provides modularity by being capable of connecting the second and third ports and also disconnecting the second and third ports.

6. The microelectronic device of claim 5, wherein the first, second, and third conductive members each comprise fuses that are integrated with the plurality of organic dielectric layers of a package substrate without increasing a height of the package substrate.

7. The microelectronic device of claim 6, wherein the second and third conductive members are formed within the cavity or one or more additional cavities of the plurality of organic dielectric layers of the package substrate.

8. The microelectronic device of claim 6, wherein the first, second, and third conductive members each comprise straight members.

9. The microelectronic device of claim 6, wherein the first, second, and third conductive members each comprise meandering members to increase a length of the member in comparison to a straight member.

10. The microelectronic device of claim 6, wherein the first, second, and third conductive members provide eight different configurations of modularity for the microelectronic device.

11. A modular structure comprising:
first and second ports of a package substrate having a plurality of organic dielectric layers; and
a first conductive member that is formed within a cavity of the package substrate, the first conductive member provides modularity by being capable of connecting the first and second ports and also disconnecting the first and second ports, wherein the first and second ports are embedded in the plurality of organic dielectric layers.

12. The modular structure of claim 11, wherein the cavity is formed by removing at least one organic dielectric in proximity to the first conductive member to release the first conductive member.

13. The modular structure of claim 11, wherein the first conductive member disconnects the first and second ports when a threshold voltage is applied between the first and second ports to cause the first conductive member to heat up to a melting point of the first conductive member.

14. The modular structure of claim 11, wherein the modular structure further comprises a third port, a second conductive member, and a third conductive member with the second conductive member being coupled to the second and third ports while the third conductive member is coupled to the first and third ports.

15. The modular structure of claim 14, wherein the second conductive member provides modularity by being capable of connecting the second and third ports and also disconnecting the second and third ports.

16. The modular structure of claim 14, wherein the first, second, and third conductive members each comprise fuses that are integrated with the plurality of organic dielectric layers of the package substrate without increasing a height of the package substrate.

17. The modular structure of claim 16, wherein the second and third conductive members are formed within the cavity or one or more additional cavities of the plurality of organic dielectric layers of the package substrate.

18. The modular structure of claim 16, wherein the first, second, and third conductive members each comprise straight members.

19. The modular structure of claim 16, wherein the first, second, and third conductive members each comprise meandering members to increase a length of the member in comparison to a straight member.

20. The modular structure of claim 16, wherein the first, second, and third conductive members provide eight different configurations of modularity for the modular structure.

21. Acomputing device comprising:
- at least one processor to process data; and
- a communication module or chip coupled to the at least one processor, the communication module or chip comprises,
- a substrate having a plurality of organic dielectric layers,
- a cavity formed in at least one organic dielectric layer of the plurality of organic dielectric layers, and a modular structure having first and second ports and a conductive member that is formed within the cavity, the conductive member provides modularity by being capable of connecting the first and second ports and also disconnecting the first and second ports, wherein the first and second ports are embedded in the plurality of organic dielectric layers.

22. The computing device of claim 21, wherein the cavity is formed by removing the at least one organic dielectric in proximity to the conductive member to release the conductive member.

23. The computing device of claim 21, wherein the conductive member disconnects the first and second ports when a threshold voltage is applied between the first and second ports to cause the conductive member to heat up to a melting point of the conductive member.

* * * * *